(12) United States Patent  
Harada et al.

(10) Patent No.: US 8,937,368 B2  
(45) Date of Patent: Jan. 20, 2015

(54) SEMICONDUCTOR DEVICE

(71) Applicant: Panasonic Corporation, Osaka (JP)

(72) Inventors: Yoshinao Harada, Hyogo (JP); Nobuo Aoi, Hyogo (JP)

(73) Assignee: Panasonic Corporation, Osaka (JP)

( * ) Notice: Subject to any disclaimer, the term of this patent is extended or adjusted under 35 U.S.C. 154(b) by 58 days.

(21) Appl. No.: 13/756,100

(22) Filed: Jan. 31, 2013

(65) Prior Publication Data

US 2013/0140680 A1 Jun. 6, 2013

Related U.S. Application Data

(63) Continuation of application No. PCT/JP2011/004182, filed on Jul. 25, 2011.

(30) Foreign Application Priority Data

Nov. 19, 2010 (JP) ................. 2010-259419

(51) Int. Cl.  
*H01L 29/40* (2006.01)  
*H01L 23/48* (2006.01)  
(Continued)

(52) U.S. Cl.  
CPC ........ *H01L 23/481* (2013.01); *H01L 21/76898* (2013.01); *H01L 29/78* (2013.01); *H01L 2224/05009* (2013.01); *H01L 2224/06181* (2013.01); *H01L 2224/13025* (2013.01)  
USPC ......................................... 257/621

(58) Field of Classification Search  
CPC ................ H01L 21/76898; H01L 23/481  
USPC ......................................... 257/621  
See application file for complete search history.

(56) References Cited

U.S. PATENT DOCUMENTS

| 6,010,769 A | 1/2000 | Sasaoka et al. |
| 6,642,124 B1 | 11/2003 | Yamauchi |

(Continued)

FOREIGN PATENT DOCUMENTS

| JP | 2-181425 A | 7/1990 |
| JP | 4-287972 A | 10/1992 |

(Continued)

OTHER PUBLICATIONS

International Search Report issued in International Patent Application No. PCT/JP2011/004182 mailed Oct. 18, 2011.

(Continued)

*Primary Examiner* — Fernando L Toledo  
*Assistant Examiner* — Neil Prasad  
(74) *Attorney, Agent, or Firm* — McDermott Will & Emery LLP

(57) ABSTRACT

A semiconductor device includes: an active region located in an upper portion of a semiconductor substrate; a through-hole electrode penetrating the substrate, and made of a conductor having a thermal expansion coefficient larger than that of a material for the substrate; and a stress buffer region located in the upper portion of the substrate and sandwiched between the through-hole electrode and the active region. The stress buffer region does not penetrate the substrate and includes a stress buffer part made of a material having a thermal expansion coefficient larger than that of the material for the substrate and an untreated region where the stress buffer part is not present. The stress buffer part is located in at least two locations sandwiching the untreated region in a cross section perpendicular to a surface of the substrate and passing through the through-hole electrode and the active region.

19 Claims, 11 Drawing Sheets

(51) Int. Cl.
*H01L 21/768* (2006.01)
*H01L 29/78* (2006.01)

(56) References Cited

U.S. PATENT DOCUMENTS

| | | | | |
|---|---|---|---|---|
| 8,039,843 | B2 * | 10/2011 | Inaba | 257/64 |
| 2003/0137056 | A1 | 7/2003 | Taniguchi et al. | |
| 2009/0160050 | A1 | 6/2009 | Miyakawa et al. | |

FOREIGN PATENT DOCUMENTS

| | | |
|---|---|---|
| JP | 7-066384 A | 3/1995 |
| JP | 2003-218525 A | 7/2003 |
| JP | 2004-039864 A | 2/2004 |
| JP | 2004-335948 A | 11/2004 |
| JP | 2005-353892 A | 12/2005 |
| JP | 2006-049930 A | 2/2006 |
| JP | 2007-059769 A | 3/2007 |
| JP | 2007-123681 A | 5/2007 |
| JP | 2007-123681 A | 5/2007 |
| JP | 2010-114352 A | 5/2010 |
| JP | 2010-114352 A | 5/2010 |
| WO | WO-97/19579 A1 | 5/1997 |
| WO | WO-2010/023812 A1 | 3/2010 |

OTHER PUBLICATIONS

Katti, G. et al. "3D stacked ICs using Cu TSVs and Die to Wafer Hybrid Collective bonding." IEEE. pp. 14.4.1-14.4.4. 2009.
Mercha, A. et al. "Impact of Thinning and Through Silicon Via Proximity on High-k / Metal Gate First CMOS Performance." IEEE. 2 pages. Jun. 15-17, 2010.

* cited by examiner

US 8,937,368 B2

SEMICONDUCTOR DEVICE

CROSS-REFERENCE TO RELATED APPLICATIONS

This is a continuation of International Application No. PCT/JP2011/004182 filed on Jul. 25, 2011, which claims priority to Japanese Patent Application No. 2010-259419 filed on Nov. 19, 2010. The disclosures of these applications are incorporated by reference herein.

BACKGROUND

The present disclosure relates to semiconductor devices and methods for fabricating semiconductor devices, and more particularly to a semiconductor device including a through-hole electrode penetrating a semiconductor substrate and a method for fabricating such a semiconductor device.

Stacked-type semiconductor devices including stacks of semiconductor chips for enhanced function and increased degrees of integration have been developed in recent years. In many conventional stacked-type semiconductor devices, semiconductor chips are stacked with intermediate substrates such as interposers sandwiched therebetween, and are electrically connected to each other by wire bonding. Consequently, the wire length increases to cause an increase in wire resistance, resulting in limitation of high-speed operation of the semiconductor devices. In addition, extension of wires increases the entire size of the semiconductor devices, resulting in limitation of miniaturization of the semiconductor devices.

To solve the foregoing problems, Japanese Patent Publication No. 2007-59769, for example, proposes a technique in which through-hole electrodes of a metal or a conductive resin are formed in semiconductor chips to connect the semiconductor chips to each other.

In this technique, first, an isolation trench is formed in the substrate from the principal surface of the substrate to a desired depth, and then is filled with an insulating film, thereby forming an isolation part. Next, a MOS field effect transistor (a MOSFET) is formed in an upper portion (near the principal surface) of the substrate, and then an interlayer insulating film is formed on the substrate. Thereafter, a conductive trench is formed in a region surrounded by the isolation part to extend halfway in the substrate from the upper surface of the interlayer insulating film in the depth direction. Subsequently, the conductive trench is filled with a conductor film, thereby forming an interconnect part. Then, the back surface of the substrate is ground and polished to a degree in which the isolation part and the interconnect part are not exposed, and then wet-etched to a degree in which the isolation part and a lower portion of the interconnect part are partially exposed, thereby forming a penetration isolation part and a penetration interconnect part.

In this manner, the stacked semiconductor chips are connected to each other at a minimum distance, thereby reducing the length of interconnection, as compared to connection by wire bonding. This configuration can reduce interconnection resistance, thereby enabling high-speed operation. This configuration can also reduce a region for wire extension, and thus the size of the entire stacked-type semiconductor device is determined depending only on the size of the semiconductor chips. In addition, thickness reduction of each of the semiconductor chips to be stacked can lead to thickness reduction of the entire stacked-type semiconductor device. Accordingly, the entire stacked-type semiconductor device can be made smaller than a conventional device.

SUMMARY

However, when a copper through-hole electrode (a through silicon via: TSV) is formed in a silicon semiconductor substrate to penetrate the semiconductor substrate, for example, the thermal expansion coefficient of the semiconductor substrate (i.e., 2.3 ppm/° C.) greatly differs from the thermal expansion coefficient of the copper TSV (i.e., 16.7 ppm/° C.). Accordingly, in a structure as proposed in Japanese Patent Publication No. 2007-59769, when the TSV approaches a device such as a transistor constituting an electrical circuit, a stress from the TSV propagates through the substrate to increase characteristic variation of the device such as a transistor to a nonnegligible degree, resulting in limitation of high-speed operation.

It is therefore an object of the present disclosure to stabilize device electrical characteristics by reducing a stress from a through-hole electrode that affects devices such as transistors.

To achieve the object, an example semiconductor device according to the present disclosure includes a stress buffer part between a through-hole electrode and an active region in an upper portion of a semiconductor substrate.

Specifically, in an aspect of the present disclosure, a semiconductor device includes: an active region located in an upper portion of a semiconductor substrate; a through-hole electrode penetrating the semiconductor substrate, and made of a conductor having a thermal expansion coefficient larger than that of a material for the semiconductor substrate; and a stress buffer region located in the upper portion of the semiconductor substrate and sandwiched between the through-hole electrode and the active region, wherein the stress buffer region does not penetrate the semiconductor substrate and includes a stress buffer part made of a material having a thermal expansion coefficient larger than that of the material for the semiconductor substrate and an untreated region where the stress buffer part is not present, and the stress buffer part is located in at least two locations sandwiching the untreated region in a cross section perpendicular to a surface of the semiconductor substrate and passing through the through-hole electrode and the active region.

The semiconductor device includes a stress buffer region located in the upper portion of the semiconductor substrate and sandwiched between the through-hole electrode and the active region, and the stress buffer region does not penetrate the semiconductor substrate and includes a stress buffer part made of a material having a thermal expansion coefficient larger than that of the material for the semiconductor substrate and an untreated region where the stress buffer part is not present, Accordingly, a tensile stress from the through-hole electrode and a compressive stress from the stress buffer part compensate for each other in the upper portion of the semiconductor substrate, thereby reducing the influence of a stress from the through-hole electrode on devices, and stabilizing electrical characteristics of devices such as transistors in the active region.

In the semiconductor device, the stress buffer part is preferably made of an insulating material including at least one of silicon oxide, nitrogen-containing silicon oxide, or silicon nitride.

In the semiconductor device, the stress buffer part is preferably made of a material including a high-density plasma film or a high-gain avalanche rushing amorphous photoconductor film.

In the semiconductor device, the stress buffer region preferably includes at least two stress buffer parts.

In the semiconductor device, the untreated region and at least one of the stress buffer parts may be circles whose centers are located approximately at the through-hole electrode.

In the semiconductor device, the untreated region and at least one of the stress buffer parts may be polygons whose centers are located approximately at the through-hole electrode.

In the semiconductor device, the untreated region may include untreated regions that are symmetric with respect to the through-hole electrode as a point of symmetry.

In the semiconductor device, the stress buffer parts and the untreated regions may be arranged in a staggered pattern around the through-hole electrode.

In the semiconductor device, the untreated regions may be provided at random around the through-hole electrode.

In the semiconductor device, the stress buffer part includes a cavity therein.

In the semiconductor device, the stress buffer part preferably includes a first stress buffer part and a second stress buffer part that is located closer to the through-hole electrode than the first stress buffer part is, and the second stress buffer part preferably has a lower end located below a lower end of the first stress buffer part.

The semiconductor device may further include a first insulating film located on the semiconductor substrate, the through-hole electrode may penetrate the first insulating film and the semiconductor substrate, and at least one of the stress buffer parts may penetrate the first insulating film.

The semiconductor device preferably includes a barrier film located between the through-hole electrode and the semiconductor substrate and made of a metal, and a second insulating film located between the barrier film and the semiconductor substrate.

In the semiconductor device, preferably, the semiconductor substrate is made of silicon whose principal surface has a surface orientation of $\{100\}$, the device is an n-type field effect transistor or a p-type field effect transistor whose channel length direction is along a crystal axis of <110>, and the through-hole electrode is located on a line along the channel length direction or a channel width direction.

In the semiconductor device, preferably, the semiconductor substrate is made of silicon whose principal surface has a surface orientation of $\{100\}$, the device is an n-type field effect transistor whose channel length direction is along a crystal axis of <100>, and the through-hole electrode is located on a line along the channel length direction or a channel width direction.

In the semiconductor device, preferably, the semiconductor substrate is made of silicon whose principal surface has a surface orientation of $\{100\}$, the device is a p-type field effect transistor whose channel length direction is along a crystal axis of <100>, the through-hole electrode is located on a line along the channel length direction or a channel width direction, the stress buffer part includes a plurality of stress buffer parts, and the number of the stress buffer parts is smaller than the number of the stress buffer parts in a case where the channel length direction is not along a crystal axis of <100> or a case where the device is an n-type field effect transistor.

In the semiconductor device, an end of the upper portion of the semiconductor substrate close to the stress buffer part is preferably rounded, and a trench is preferably formed in a boundary between the semiconductor substrate and the stress buffer part.

In the semiconductor device, the trench preferably has a depth of 13 nm or more.

A method for fabricating a semiconductor device in an aspect of the present disclosure includes the steps of: (a) forming a stress buffer region in an upper portion of a semiconductor substrate, the stress buffer region being located at each side of an active region and including a stress buffer part made of an insulating material with a thermal expansion coefficient larger than that of a material for the semiconductor substrate; and (b) forming a through-hole electrode in the semiconductor substrate, the through-hole electrode penetrating the semiconductor substrate and having a large thermal expansion coefficient. The stress buffer region is located between the active region and the through-hole electrode. In step (a), the stress buffer region includes an untreated region where the stress buffer part is not present, and the stress buffer part is located in at least two locations sandwiching the untreated region in a cross section perpendicular to a surface of the semiconductor substrate and passing through the through-hole electrode and the active region.

In the method for fabricating a semiconductor device, the stress buffer region including a stress buffer part made of an insulating material having a thermal expansion coefficient larger than that of the material for the semiconductor substrate is located between the active region and the through-hole electrode, thereby stabilizing a stress in the active region. Accordingly, electrical characteristics of devices such as transistors can be stabilized.

In the method for fabricating a semiconductor device, in step (b), a through-hole electrode is preferably formed by forming an electrode hole in the upper portion of the semiconductor substrate, filling the electrode hole with a conductor, and exposing the conductor at the lower surface of the semiconductor substrate.

In the method for fabricating a semiconductor device, in step (b), a through-hole electrode may be formed by forming a through hole penetrating the semiconductor substrate and filling the through hole with a conductor.

In the method for fabricating a semiconductor device, step (b) may be performed after step (a).

In the method for fabricating a semiconductor device, step (a) may be performed after step (b).

In the method for fabricating a semiconductor device, in step (b), the stress buffer part is preferably made of an insulating material including at least one of silicon oxide, nitrogen-containing silicon oxide, or silicon nitride.

In the method for fabricating a semiconductor device, in step (a), the stress buffer part is preferably made of a material including a high-density plasma film or a high-gain avalanche rushing amorphous photoconductor film.

In the method for fabricating a semiconductor device, in step (a), the stress buffer region preferably includes at least two stress buffer parts.

In the method for fabricating a semiconductor device, in step (a), the untreated region and at least one of the stress buffer parts may be circles whose centers are located approximately at the through-hole electrode.

In the method for fabricating a semiconductor device, in step (a), the untreated region and at least one of the stress buffer parts may be polygons whose centers are located approximately at the through-hole electrode.

In the method for fabricating a semiconductor device, in step (a), the untreated region may include untreated regions that are symmetric with respect to the through-hole electrode as a point of symmetry.

In the method for fabricating a semiconductor device, in step (a), the stress buffer parts and the untreated regions may be arranged in a staggered pattern around the through-hole electrode.

In the method for fabricating a semiconductor device, in step (a), the untreated regions may be provided at random around the through-hole electrode.

The method for fabricating a semiconductor device may further include step (c) of forming a cavity in the stress buffer part.

In the method for fabricating a semiconductor device, in step (b), a first stress buffer part and a second stress buffer part that is located closer to the through-hole electrode than the first stress buffer part is, and the second stress buffer part is formed to be deeper than the first stress buffer part.

The method for fabricating a semiconductor device may further include step (d) of forming a first insulating film on the semiconductor substrate, the through-hole electrode may penetrate the first insulating film, and at least one of the stress buffer parts may penetrate the first insulating film.

The method for fabricating a semiconductor device preferably further includes steps: (e) forming a second insulating film on a side wall of the electrode hole; and (f) forming a barrier film of a metal on the second insulating film on the side wall of the electrode hole.

In the method for fabricating a semiconductor device, step (a) may be the step of forming an n-type field effect transistor or a p-type field effect transistor whose channel length direction is along a crystal axis of <110> in an upper portion of the semiconductor substrate of silicon whose principal surface has a surface orientation of {100}, and step (b) may be the step of forming a through-hole electrode on a line along the channel length direction or a channel width direction.

In the method for fabricating a semiconductor device, step (a) may be the step of forming an n-type field effect transistor whose channel length direction is along a crystal axis of <100> in an upper portion of the semiconductor substrate of silicon whose principal surface has a surface orientation of {100}, and step (b) may be the step of forming a through-hole electrode on a line along the channel length direction or a channel width direction.

In the method for fabricating a semiconductor device, step (a) may be the step of forming a p-type field effect transistor whose channel length direction is along a crystal axis of <100> in an upper portion of the semiconductor substrate of silicon whose principal surface has a surface orientation of {100}, step (b) may be the step of forming a through-hole electrode on a line along the channel length direction or a channel width direction, and the number of the stress buffer parts may be smaller than the number of the stress buffer parts in a case where the channel length direction is not along a crystal axis of <100> or a case where the device is an n-type field effect transistor.

The method for fabricating a semiconductor device preferably further includes the step (g) of rounding an end of the upper portion of the semiconductor substrate close to the stress buffer part and the step of forming a trench in a boundary between the semiconductor substrate and the stress buffer part.

In the method for fabricating a semiconductor device, step (g) is preferably the step of forming the trench having a depth of 13 nm or more.

As described above, a semiconductor device and a method for fabricating a semiconductor device according to the present disclosure can reduce the influence of a stress from a through-hole electrode on devices, and stabilize electrical characteristics of devices such as transistors formed in an active region.

BRIEF DESCRIPTION OF THE DRAWINGS

FIG. 1A is a cross-sectional view, and FIGS. 1B and 1C are plan views each illustrating a portion of FIG. 1A.

DETAILED DESCRIPTION (First Embodiment)

Figure 1A:
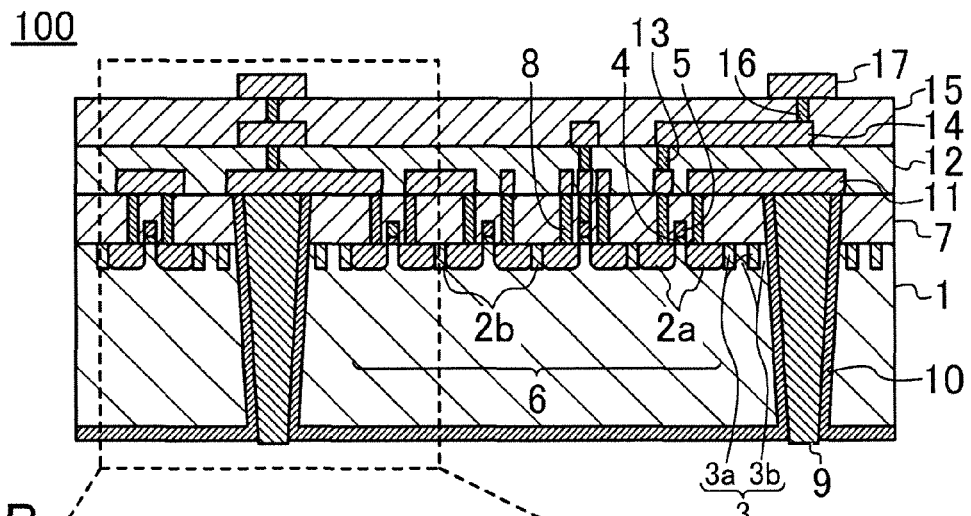
FIGS. 1A-1C illustrate a semiconductor device according to a first embodiment.

A semiconductor device according to a first embodiment will be described with reference to FIG. 1A. As illustrated in FIG. 1A, impurity regions 2a and isolation regions 2b are defined in an upper portion (near the principal surface) of a semiconductor substrate 1, and gate insulating films 4 and gate electrodes 5 are stacked in this order on the semiconductor substrate 1, thereby forming an active region 6 including devices such as transistors and diodes. The isolation regions 2b electrically insulate the devices from each other. A stress buffer region 3 is defined in an upper portion of the semiconductor substrate 1, and includes stress buffer parts 3a and an untreated region 3b where the stress buffer parts 3a are not present. The stress buffer parts 3a are made of a material having a thermal expansion coefficient larger than that of a material for the semiconductor substrate 1. The stress buffer parts 3a are made of an insulating material including at least one of silicon oxide ($SiO_2$), nitrogen-containing silicon oxide (SiON), or silicon nitride ($Si_3N_4$). The stress buffer parts 3a may be filled with a film including a high density plasma (HDP) film obtained by high density plasma chemical vapor deposition (HDP-CVD) or a sub-atmospheric CVD oxide film obtained by sub-atmospheric CVD. The stress buffer parts 3a may include a shallow trench isolation (STI) structure. The stress buffer parts 3a and the isolation regions 2b may be made of an identical material, may be formed by an identical method, and/or may be formed through an identical process. A first interlayer insulating film 7 that is a first insulating film of, for example, $SiO_2$ is formed on the semiconductor substrate 1 to cover the gate electrodes 5 and the gate insulating films 4. Contact plugs 8 are formed through the first interlayer insulating film 7 to be connected to the impurity regions 2a or the gate electrodes 5. Through-hole electrodes 9 are formed through the semiconductor substrate 1 and the first interlayer insulating film 7 to be exposed at the lower surface (the back surface) of the semiconductor substrate 1. An insulating film 10 that is a second insulating film is formed to cover side surfaces of the through-hole electrodes 9 and the lower surface of the semiconductor substrate 1. The through-hole electrodes 9 are made of a conductor having a thermal expansion coefficient larger than that of the material for the semiconductor substrate 1. The diameter of each of the through-hole electrodes 9 decreases from the upper surface of the semiconductor substrate 1 (i.e., the upper surface of the first interlayer insulating film 7) toward the lower surface of the semiconductor substrate 1, and is at the minimum in a portion exposed at the lower surface of the semiconductor substrate 1. That is, each of the through-hole electrodes 9 has a reverse-tapered shape in cross section. Each of the through-hole electrodes 9 may have a parallel-tapered shape or a tapered shape in cross section. First interconnects 11 connected to the contact plugs 8 and the through-hole electrodes 9 and a second interlayer insulating film 12 covering the first interconnects 11 are formed on the first interlayer insulating film 7. First vias 13 connected to the first interconnects 11 are formed in an upper portion of the second interlayer insulating film 12. Second interconnects 14 connected to the first vias 13 and a third interlayer insulating film 15 covering the second interconnects 14 are formed on the second interlayer insulating film 12. Second vias 16 connected to the second interconnects 14 are formed in an upper portion of the third interlayer insulating film 15. Electrode pads 17 connected to the second vias 16 are formed on the third interlayer insulating film 15.

Now, a mechanism in which the stress buffer region 3 reduces a stress from the through-hole electrode 9. In a case where the through-hole electrode 9 of copper is formed in the semiconductor substrate 1 of silicon, since silicon has a thermal expansion coefficient of 2.3 ppm/° C. and copper has a thermal expansion coefficient of 16.7 ppm/° C., the difference in thermal expansion coefficient generates a tensile stress in an upper portion of the semiconductor substrate 1 toward the through-hole electrode 9. When the stress buffer part 3a mainly containing $SiO_2$ is formed in the upper portion of the semiconductor substrate 1, since $SiO_2$ has a thermal expansion coefficient of 8.0 ppm/° C., a compressive stress occurs from the stress buffer part 3a to the semiconductor substrate 1 after a process at a high temperature of 1000° C. or more in a process for forming the stress buffer parts 3a. Consequently, the tensile stress from the through-hole electrode 9 and the compressive stress from the stress buffer part 3a compensate for each other in the upper portion of the semiconductor substrate 1.

Figure 1B:
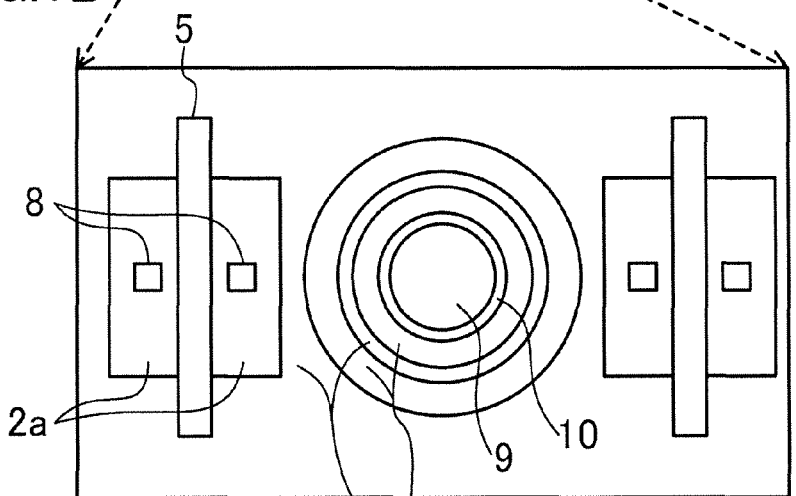
Figure 1C:
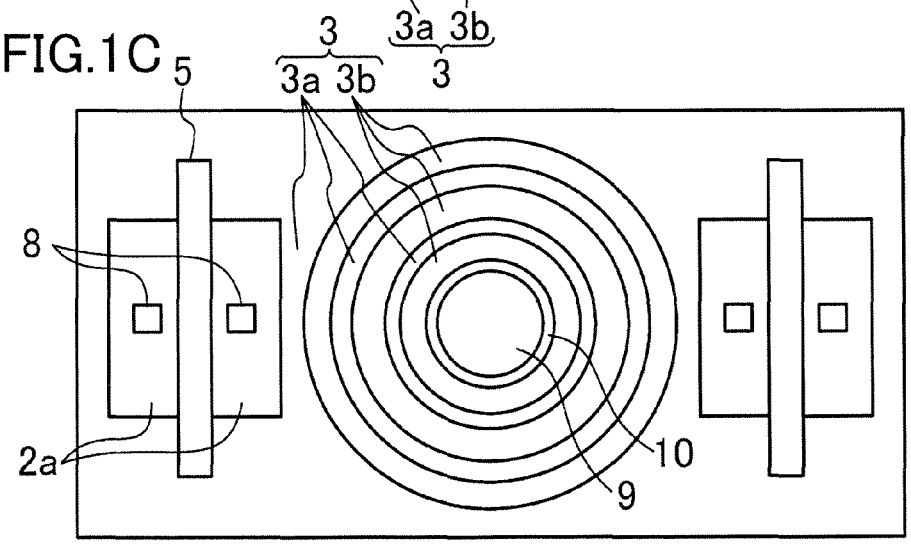

Then, a positional relationship among the through-hole electrode 9, the stress buffer region 3, and the active region 6 will be described with reference to FIGS. 1B and 1C. In FIGS. 1B and 1C, the first interlayer insulating film 7 and components formed in layers above the first interlayer insulating film 7 are not shown.

As illustrated in FIG. 1B, an insulating film 10 is provided around a through-hole electrodes 9 to obtain insulation. The insulating film 10 is surrounded by an untreated region 3b, and this untreated region 3b is surrounded by a stress buffer part 3a. This stress buffer part 3a is surrounded by another untreated region 3b. Outside this another untreated region 3b, a stress buffer part 3a is provided to surround impurity regions 2a constituting a device such as a transistor. That is, two stress buffer parts 3a are provided in a portion of the stress buffer region 3 between the impurity regions 2a close to the through-hole electrode 9. In other words, two stress buffer parts 3a sandwich the untreated region 3b in a cross section perpendicular to the surface of the semiconductor substrate 1 and passing through the through-hole electrode 9 and the active region 6. One of the stress buffer parts 3a closer to the through-hole electrode 9 is preferably located at a distance of about 1-5 µm from the through-hole electrode 9, and preferably has a width of about 1-3 µm. The outer stress buffer part 3a is preferably apart from the inner stress buffer part 3a by about 1-5 µm, and preferably has a width of about 1-3 µm.

As illustrated in FIG. 1C, another pair of a stress buffer part 3a and an untreated region 3b may be provided in a portion of the stress buffer region 3 between the through-hole electrode 9 and the impurity region 2a. The number of the stress buffer parts 3a is not limited to two or three, and three or more stress buffer parts 3a may be provided in a portion of the stress buffer region 3 between the through-hole electrode 9 and the impurity region 2a.

In this embodiment, the untreated regions 3b and at least one of the stress buffer parts 3a are circles whose centers are located approximately at the through-hole electrode 9. The circular stress buffer parts 3a can uniformly stabilize stress variations in any orientation with respect to all the plane orientations of the semiconductor substrate 1. That is, characteristics variations of the device due to variations of unwanted stresses can be effectively reduced irrespective of the position of the device relative to the through-hole electrode 9.

Now, a structure for canceling a stress in an upper portion of the silicon semiconductor substrate 1 to obtain stability will be described with reference to FIG. 2.

Figure 2:
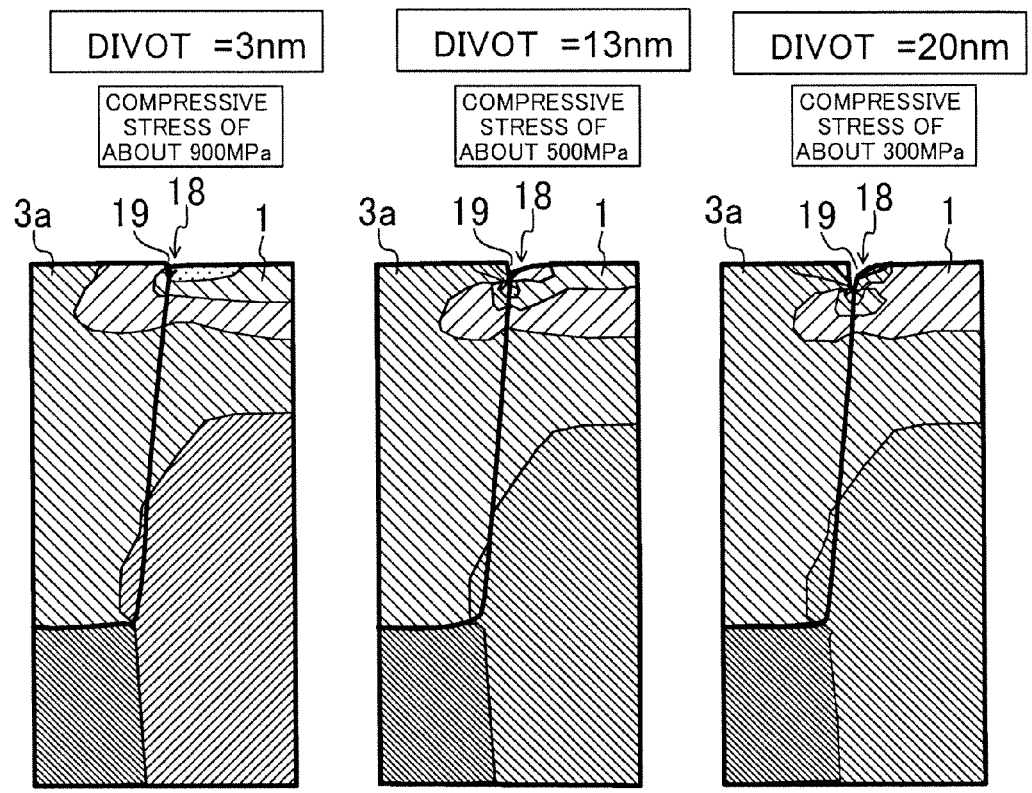
FIG. 2 shows a relationship between stress distribution in the lateral direction and the depth of a divot between a semiconductor substrate and a stress buffer part in the first embodiment.

As illustrated in FIG. 2, an end of the semiconductor substrate 1 close to the stress buffer part 3a is rounded (i.e., has a rounded portion 18), thereby significantly effectively reducing a local stress in the upper portion of the semiconductor substrate 1. In addition, a trench (a divot) 19 is formed in the boundary between the semiconductor substrate 1 and the stress buffer part 3a, thereby significantly effectively reducing a local stress in the upper portion of the semiconductor substrate 1. To prove this mechanism, stress distributions are calculated for the cases where the depth of the divot 19 is 3 nm, 13 nm, and 20 nm. The stress distributions are calculated under conditions in which the thickness from the upper surface to the lower surface of the silicon semiconductor substrate 1 is 0.2 µm, the depth of the $SiO_2$ stress buffer part 3a is 0.25 µm, and the semiconductor substrate 1 and the stress buffer part 3a are subjected to rapid thermal anneal (RTA) and then cooled to room temperature. As the depth of the divot 19 increases to 3 nm, 13 nm, and then 20 nm, stress on the periphery of the rounded portion 18 at the end of the semiconductor substrate 1 decreases to about 900 MPa, about 500 MPa, and then about 300 MPa. Although not shown, in a case where the surfaces of the semiconductor substrate 1 and the stress buffer part 3a are flush with each other, a compressive stress of about 1000 MPa occurs in the upper portion of the semiconductor substrate 1. Thus, the depth of the divot 19 is preferably large as described above, and is preferably 13 nm or more. Then, a stress in a case where the surfaces of the semiconductor substrate 1 and the stress buffer part 3a are flush with each other can be reduced to a half. As described above, the divot 19 and the rounded portion 18 can reduce a stress in the upper portion of the semiconductor substrate 1. Increase in the depth of the divot 19 and/or the roundness of the rounded portion 18 can enhance the degree of reduction of a stress in the upper portion of the semiconductor substrate 1. Specifically, a combination of the rounded portion 18 of the semiconductor substrate 1 and the divot 19 in the outer periphery of the semiconductor substrate 1 can stabilize a stress. Accordingly, synergistic effects by the rounded portion 18 and the divot 19 can effectively stabilize a remaining stress after the compensation between the tensile stress from the through-hole electrode 9 and the compressive stress from the stress buffer part 3a in the upper portion of the semiconductor substrate 1.

Thus, the structure as described above that can cancel and stabilize a stress in the upper portion of the silicon semiconductor substrate in the semiconductor device including the through-hole electrodes can stabilize electrical characteristics of devices such as transistors in the active region.

Since the devices such as transistors are formed in an upper portion of the semiconductor substrate 1, it is important to provide measures especially against a stress on the upper surface. In a case where devices are provided in an upper portion of the semiconductor substrate 1 and the through-hole electrode 9 is located on a line along the transistor channel width (W) direction, in an n-type field effect transistor (an nFET), a driving current along the channel length (Lg) direction decreases by about 0.5% when the distance between the through-hole electrode 9 and the transistor approaches about 5 μm. In a p-type field effect transistor (a pFET), the driving current increases by about 4.5% when the distance between the through-hole electrode 9 and the transistor approaches about 5 μm. In a case where the through-hole electrode 9 is located on a line along the Lg, in the nFET, the driving current increases by about 0.6% when the distance between the through-hole electrode 9 and the transistor approaches about 5 μm, whereas in the pFET, the driving current decreases by about 2.7% when the distance between the through-hole electrode 9 and the transistor approaches about 5 μm. That is, the driving current has a variation width of about 1.1% in the nFET, and a variation width of about 7.2% in the pFET. Accordingly, occurrences of such stress from the through-hole electrode 9 are superimposed, resulting in necessity of a buffer region with a radius of 20 μm or more between the through-hole electrode 9 and the active region 6 where the device is formed. As a result, the problem of consumption of an unnecessary area (i.e., occurrence of an area penalty) arises. In addition, disadvantageously, electrical characteristics of devices such as transistors become more unstable. Specifically, as described above, a maximum variation of the driving current of 7% or more was measured.

Results of micro-Raman analysis on a stress near an upper portion of the silicon semiconductor substrate 1 around the copper through-hole electrode 9 will be described below with reference to FIGS. 3A and 3B.

Figure 3A:
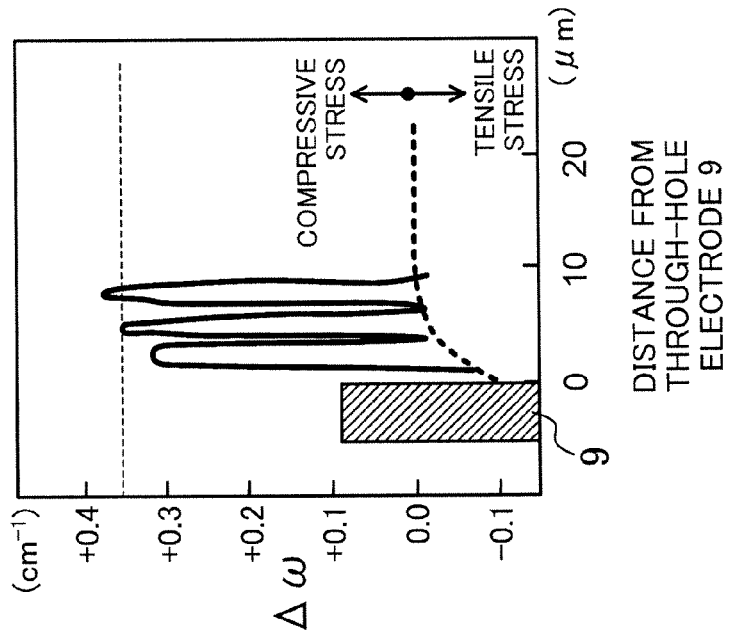
FIGS. 3A and 3B show variations of Raman shift around a through-hole electrode of the semiconductor device of the first embodiment obtained by micro-Raman analysis.
Figure 3B:
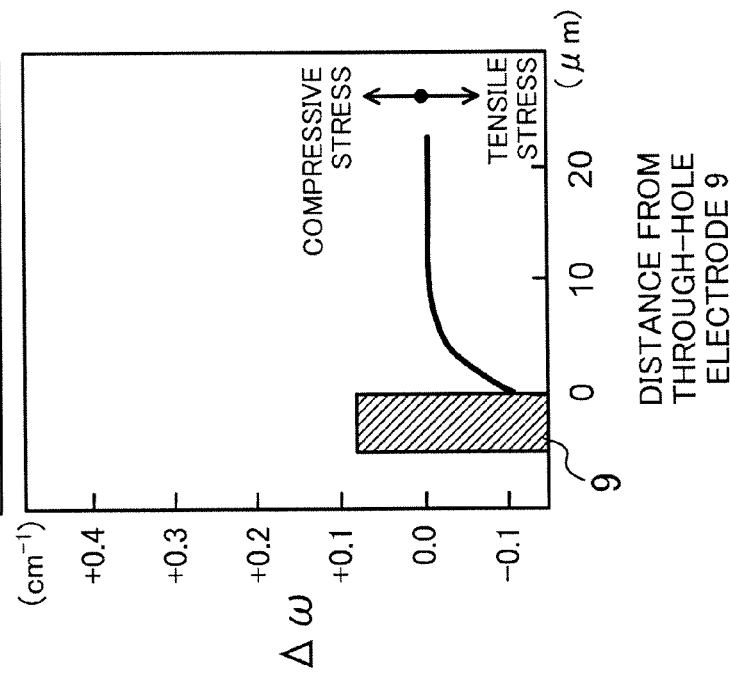

As shown in FIG. 3A, in an upper portion of the silicon semiconductor substrate 1 near the through-hole electrode 9, Raman shift $\Delta\omega$ was about $-0.1$ cm$^{-1}$, i.e., a tensile stress occurred. As a buffer region in which this tensile stress is completely eliminated, a region with a radius of 12-13 μm or more from the through-hole electrode 9 is needed. As shown in FIG. 3B, in a case where three stress buffer parts 3a are formed around the through-hole electrode 9, suppose stresses are simply added together, a variation of Raman shift is expected to occur based on the measurement results. In a region around a region where two or more stress buffer parts 3a are provided, the Raman shift $\Delta\omega$ was about $+0.35$ cm$^{-1}$, i.e., a compressive stress occurred. That is, in general, a combination of a region provided with parallel stress buffer parts 3a and a region provided with no stress buffer parts 3a (i.e., an untreated region) is expected to cause compressive stresses from the stress buffer parts 3a to converge to the same degree, based on the assumption that stresses are simply added together.

In the semiconductor device of the first embodiment, since a stress in the active region can be stabilized, and accordingly, electrical characteristics of devices such as transistors can be stabilized. In addition, totally unlike the existing idea of avoiding a stress by simply separating the buffer region from the through-hole electrodes, the size of the buffer region, which conventionally needed to have a radius of 12-13 μm or more about the through-hole electrode, can be effectively reduced to a half or less. Accordingly, the size of the semiconductor device can be reduced.

Now, a method for fabricating a semiconductor device according to the first embodiment will be described with reference to FIGS. 4A-4F and 5A-5C.

Figure 4A:
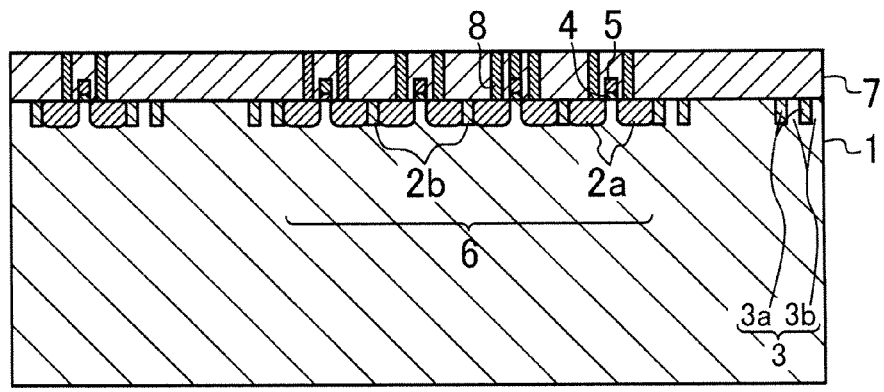
FIGS. 4A-4D are cross-sectional views illustrating process steps of a method for fabricating a semiconductor device according to the first embodiment.

First, as illustrated in FIG. 4A, impurity regions 2a necessary for forming devices such as transistors and diodes are defined by, for example, ion implantation in an upper surface (near the surface) of a semiconductor substrate 1. An active region 6 is formed by defining isolation regions 2b by a process similar to that for defining, for example, an STI. In defining the isolation regions 2b, stress buffer parts 3a made of the same material as the isolation regions 2b are also formed in the upper portion of the semiconductor substrate 1 by the same method as that for the isolation regions 2b. The material and method for the stress buffer parts 3a may be different from those for the isolation regions 2b. In forming the stress buffer parts 3a, heat treatment is preferably performed at 1000° C. or more. The stress buffer parts 3a are also formed between the active region 6 and a region where a through-hole electrode is to be formed in a later step such that the stress buffer parts 3a and the regions where the stress buffer parts 3a are not present (i.e., untreated regions 3b) are alternately arranged, thereby forming a stress buffer region 3. The stress buffer parts 3a are made of a material having a thermal expansion coefficient larger than that of a material for the semiconductor substrate 1. Then, gate insulating films 4 and gate electrodes 5 are stacked in this order on the semiconductor substrate 1, and a first interlayer insulating film 7 is formed to cover the gate electrodes 5 and the gate insulating films 4 on the semiconductor substrate 1. Thereafter, contact plugs 8 are formed by, for example, lithography and etching in the first interlayer insulating film 7 to be connected to the impurity regions 2a or the gate electrodes 5.

Figure 4B:
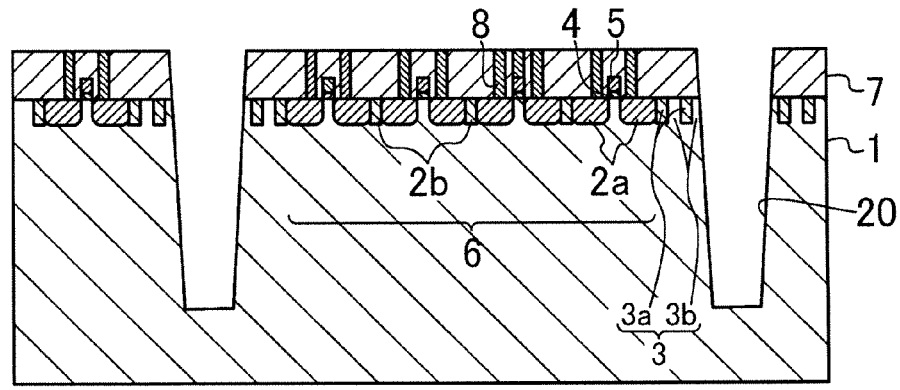

Next, as illustrated in FIG. 4B, electrode holes 20 are formed through the first interlayer insulating film 7 to extend halfway in the semiconductor substrate 1. The electrode holes 20 may be through holes reaching the lower surface (the back surface) of the semiconductor substrate 1. In this embodiment, however, formation of the electrode holes 20 is stopped halfway in the semiconductor substrate 1 in correspondence with the depth necessary in the final structure. The electrode holes 20 are not formed in the active region 6. Formation of the electrode holes 20 employs a known method. For example, the electrode holes 20 may be formed by forming a resist (not shown) by pattering with lithography, and then performing etching such as dry etching or wet etching with the resist used as a mask. Alternatively, the electrode holes 20 may be formed by using a laser such as a carbon dioxide ($CO_2$) laser or a yttrium aluminum garnet (YAG) laser.

In this embodiment, the opening size of each of the electrode holes 20 decrease from the upper surface of the semiconductor substrate 1 (the upper surface of the first interlayer insulating film 7) toward the lower surface of the semiconductor substrate 1, i.e., is at the maximum at the upper surface of the first interlayer insulating film 7, and is at the minimum at the lower surface of the semiconductor substrate 1. Specifically, the minimum diameter of each of the electrode holes 20 is, for example, about 0.1-20 μm, and is preferably about 0.5-5 μm. The maximum diameter of each of the electrode holes 20 is, for example, about 1-50 μm. The depth of each of the electrode holes 20 is, for example, about 5-50 μm.

Figure 4C:

Then, as illustrated in FIG. 4C, insulating films 10 of ozone-tetraethoxysilane ($O^3$-TEOS) films obtained by, for example, sub-atmospheric chemical vapor deposition (SACVD) are formed on the bottoms and side walls of the electrode holes 20. Subsequently, conductive parts 9A of a conductor material having a thermal expansion coefficient larger than that of the material for the semiconductor substrate 1 are formed on the insulating films 10 to fill the electrode holes 20. Barrier films for preventing diffusion of the material for the conductive parts 9A are preferably formed between the conductive parts 9A and the insulating films 10 in the electrode holes 20. The barrier films are preferably made of, for example, tantalum (Ta), tantalum nitride (TaN), or titanium nitride (TiN). Specifically, the barrier films are formed by depositing Ta by physical vapor deposition (PVD) to about 80 nm over the insulating films 10 before formation of the conductive parts 9A. After the formation of the barrier films, a seed layer of copper (Cu) is deposited by PVD to about 300 nm, and the electrode holes 20 are filled with copper by electrochemical deposition (ECD), thereby forming the conductive parts 9A. The conductive parts 9A are preferably made of, for example, copper (Cu), tungsten (W), aluminium (Al), or polysilicon. Normal-pressure annealing or high-pressure annealing may be performed under predetermined conditions. The copper portion rising from the first interlayer insulating film 7 is subjected to chemical mechanical polishing (CMP) until the upper surfaces of the conductive parts 9A are planarized.

Figure 4D:
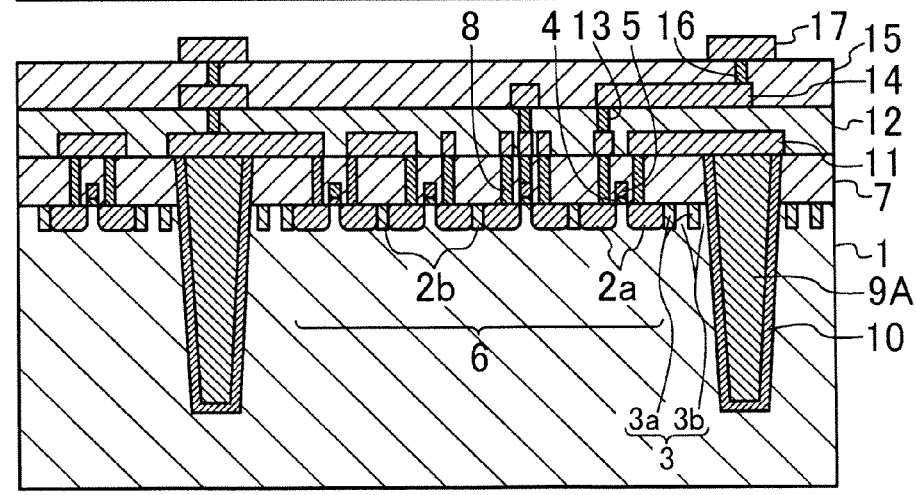

Thereafter, as illustrated in FIG. 4D, a second interlayer insulating film 12 is formed on the first interlayer insulating film 7 by a known method, and first interconnects 11 connected to the contact plugs 8 and first vias 13 connected to the first interconnects 11 are formed in the second interlayer insulating film 12. The first interconnects 11 cover the conductive parts 9A. Subsequently, a third interlayer insulating film 15 is formed on the second interlayer insulating film 12, and second interconnects 14 connected to the first vias 13 and second vias 16 connected to the second interconnect 14 are formed in the third interlayer insulating film 15. Then, electrode pads 17 connected to the second vias 16 are formed on the third interlayer insulating film 15.

In FIG. 4D, two-layer interconnects are shown. Alternatively, the number of interconnect layers may be changed as necessary, and the present disclosure is not limited to the two-layer interconnects.

Figure 5A:
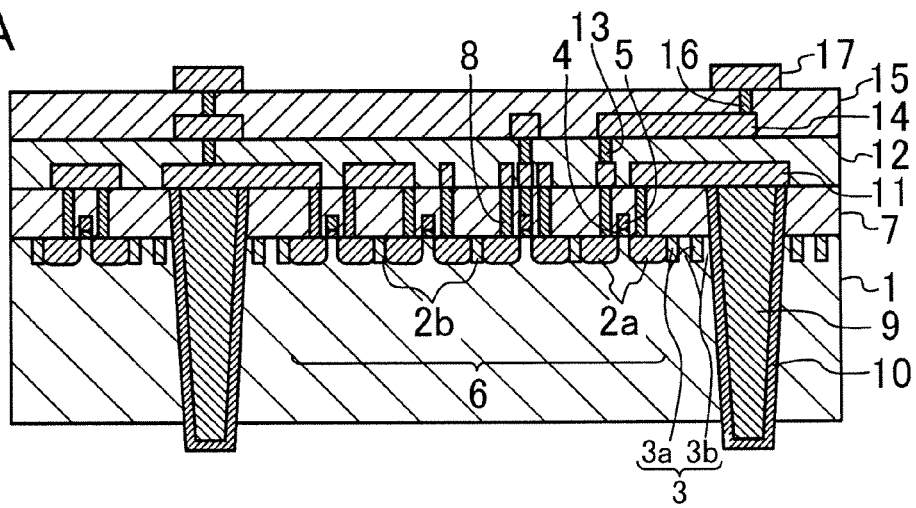
FIGS. 5A-5C are cross-sectional views illustrating process steps of the method for fabricating a semiconductor device of the first embodiment.

Then, as illustrated in FIG. 5A, the semiconductor substrate 1 is thinned from the lower surface of the semiconductor substrate 1. This thinning can be performed by mechanical grinding and polishing or chemical grinding and polishing, for example. In this embodiment, the final thickness of the semiconductor substrate 1 is reduced to about 5-150 μm, for example, so that the conductive parts 9A are exposed, thereby forming the through-hole electrodes 9. The through-hole electrodes 9 may project from the semiconductor substrate 1. The thinner semiconductor substrate 1 is more fragile, and is more likely to suffer from problems such as cracks. To avoid such problems, the upper surface of the semiconductor device may be attached to a supporter to reinforce the semiconductor substrate 1.

Figure 5B:
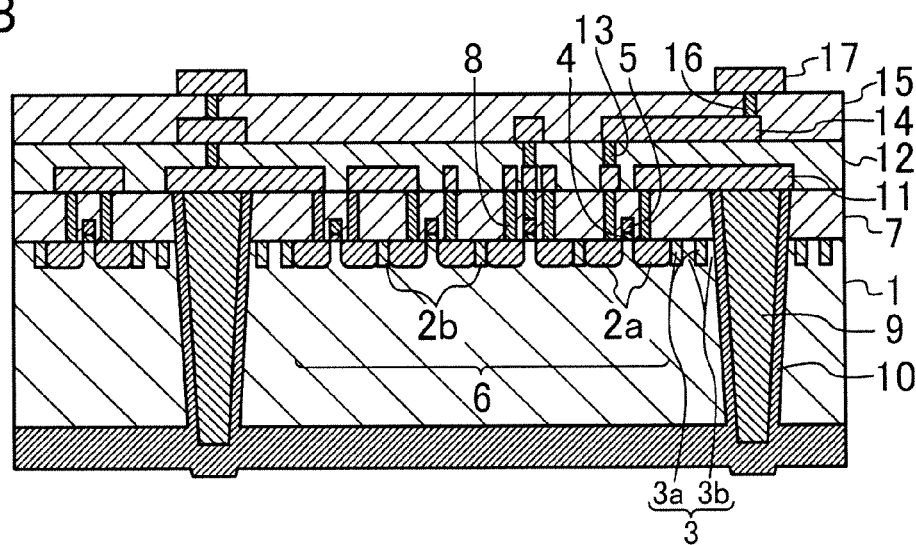

Thereafter, as illustrated in FIG. 5B, an insulating film 10 is formed to cover the lower surface of the semiconductor substrate 1 and the through-hole electrodes 9. The insulating film 10 may be made of, for example, $SiO_2$ or SiN. The insulating film 10 may be formed in such a manner that before formation of the insulating film 10, a resist is formed by a known method such as lithography in a region where the insulating film 10 is not present in the final structure on the lower surface of the semiconductor substrate 1, then the insulating film 10 is formed, and then a portion of the insulating film 10 located in this region is removed together with the resist. The insulating films 10 on the side walls of the electrode holes 20 and the insulating film 10 covering the lower surface of the semiconductor substrate 1 are integrated in the final structure.

Figure 5C:
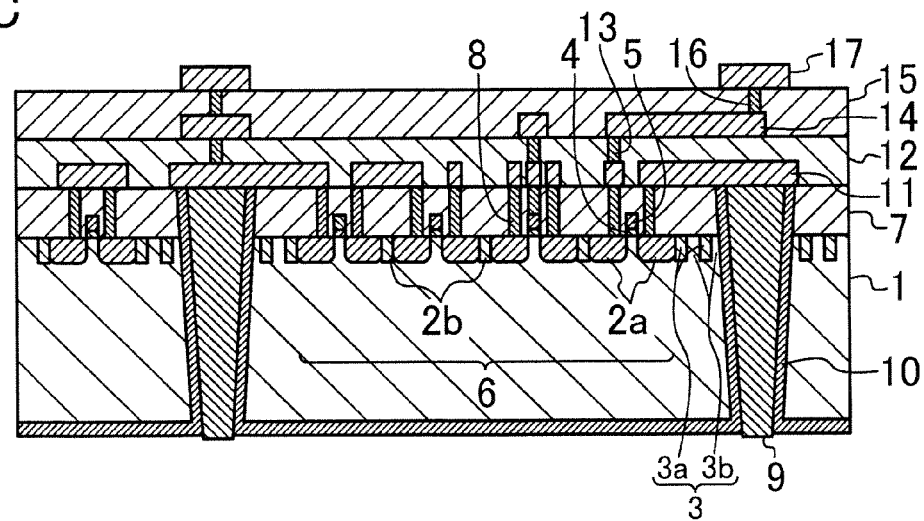

Subsequently, as illustrated in FIG. 5C, to cause the through-hole electrodes 9 to project from the lower surface of the semiconductor substrate 1, the insulating film 10 on the lower surface of the semiconductor substrate 1 is selectively etched, thereby reducing the thickness of the insulating film 10. This etching may be dry etching or wet etching. In the case of not causing the through-hole electrodes 9 to project, the lower surface of the insulating film 10 may be flush with the bottom surfaces of the through-hole electrodes 9. Alternatively, back surface bumps may be formed to be electrically coupled to the projecting portions of the through-hole electrodes 9.

Through the foregoing process steps, a semiconductor device according to this embodiment is fabricated.

In this embodiment, the diameters of the through-hole electrodes 9 decrease from the upper surface of the semiconductor substrate 1 (the upper surface of the first interlayer insulating film 7) toward the lower surface of the semiconductor substrate 1. That is, the through-hole electrodes 9 have so-called reverse-tapered shapes. In this embodiment, however, the shape of the through-hole electrodes 9 in cross section are not specifically limited, and the through-hole electrodes 9 may have other shapes in cross section in consideration of, for example, easiness of formation of the through-hole electrodes 9. Specifically, the shapes of the through-hole electrodes 9 in cross section may be such that the through-hole electrodes 9 are reverse tapered in cross section from the upper surface of the semiconductor substrate 1 to a halfway point of the semiconductor substrate 1, and have side surfaces perpendicular to the upper surface of the semiconductor substrate 1 below the halfway point. The through-hole electrodes 9 may have reverse-tapered shapes with undercuts near the upper surface of the semiconductor substrate 1 in cross section. Specifically, only the diameters of portions of the through-hole electrodes 9 near the upper surface of the semiconductor substrate 1 may be larger than those of the other portions of the through-hole electrodes 9. In a case where the through-hole electrodes 9 are also present in the first interlayer insulating film 7 as described in this embodiment, only the diameters of portions of the through-hole electrodes 9 near the upper surface of the first interlayer insulating film 7 may be larger than those of the other portions of the through-hole electrodes 9. Then, it is possible to efficiently provide the through-hole electrode 9 as well as to reduce contact resistance between the through-hole electrodes 9 and the interconnects or the electrode pads, for example, without an increase in the area occupied by the through-hole electrodes 9 in the semiconductor substrate 1.

In this embodiment, the first interconnects 11 are connected to the through-hole electrodes 9. However, the present disclosure is not limited to this structure. Alternatively, the through-hole electrodes 9 may be connected to interconnects in another layer, e.g., the second interconnects 14, or the electrode pads 17. The through-hole electrodes 9 do not need to be connected to, for example, interconnects in the semiconductor device. The fabrication method is appropriately modified from the method of this embodiment, in accordance with cases as described above. For example, the fabrication method may be modified such that the electrode holes 20 are formed from the lower surface of the semiconductor substrate 1 after formation of the second interlayer insulating film 12 or the third interlayer insulating film 15.

In this embodiment, the pitch of the through-hole electrodes 9 is, for example, about 25-50 μm, and the diameter of each of the through-hole electrodes 9 is about 5-20 μm, and in some cases, in the range of about 0.5-100 μm. The thickness of the semiconductor substrate 1 or the depth of each of the through-hole electrodes 9 is about 30-50 μm, and in some cases, in the range of about 5-400 μm. The aspect ratio of each of the through-hole electrodes 9 is in the range of about 0.5-40. The resistance between the through-hole electrodes 9 and the electrode layer is about 0.1-10Ω, and the electrical capacitance between the through-hole electrodes 9 and the electrode layer is about 100-150 fF.

In this embodiment, as the order of process steps called "via-middle," after formation of MOSFETs, the conductive parts 9A are formed, and then the multi-layer interconnects are formed, as an example. Alternatively, in this embodiment, as the order of process steps called "via-first," after formation of the conductive parts 9A, MOSFETs and then multi-layer interconnects may be formed in this order. In this embodiment, as the order of process steps called "front-side-via" of "via-last," the process steps may be such that after formation of MOSFETs, the conductive parts 9A are formed from the upper surface of the semiconductor substrate 1, then multi-layer interconnects are formed, and then the conductive parts 9A and the multi-layer interconnects are connected to each other. Further, in this embodiment, as the order of process steps called "back-side-via" of "via-last," the process steps may be such that after formation of MOSFETs, multi-layer interconnects are formed, then the semiconductor substrate 1 is thinned from the back surface thereof, and then the conductive parts 9A are formed from the lower surface of the semiconductor substrate 1.

The method for fabricating a semiconductor device of the first embodiment can stabilize a stress in the active region, and accordingly, stabilize electrical characteristics of devices such as transistors. In addition, unlike the existing idea of avoiding a stress by simply separating the buffer region from the through-hole electrodes, the buffer region, which needed to have a radius of 12-13 μm or more about the through-hole electrodes, can be reduced to a half or less, thereby effectively reducing the size of the buffer region. Accordingly, the size of the semiconductor device can be reduced.

(First Variation of First Embodiment)

A semiconductor device according to a first variation of the first embodiment will be described with reference to FIGS. 6A and 6B. In this variation, components already described in the first embodiment are not described again, and only different aspects are described.

Figure 6A:
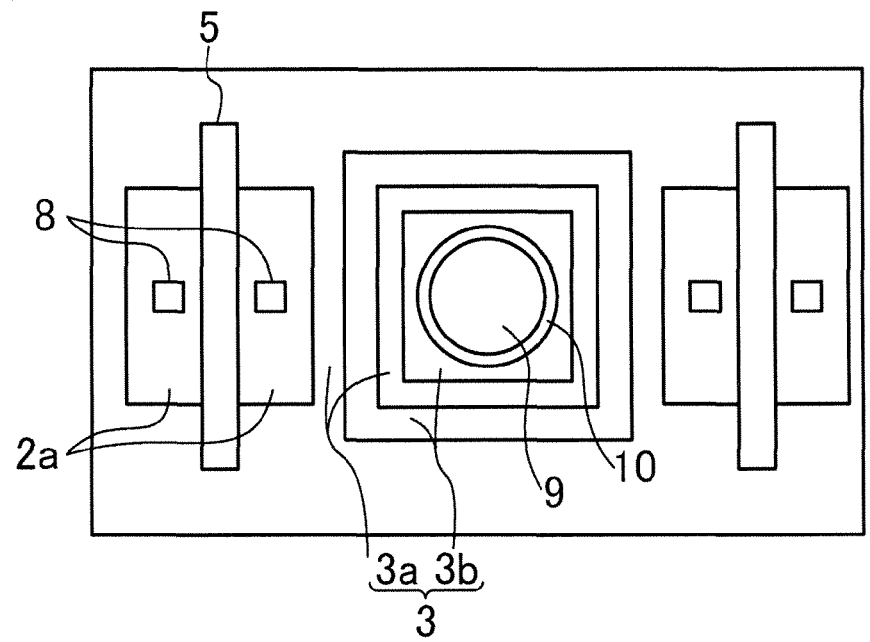
FIGS. 6A and 6B are plan views each illustrating a portion of a semiconductor device according to a first variation of the first embodiment.

As illustrated in FIG. 6A, this variation is different from the first embodiment in that rectangular stress buffer parts 3a are formed to surround the through-hole electrode 9. The shape of the stress buffer part 3a may be a polygon including a triangle except a rectangle. The inner one of the stress buffer parts 3a closer to the through-hole electrode 9 is preferably located at a distance of about 1-5 μm from the through-hole electrode 9, and preferably has a width of about 1-3 μm. The outer one of the stress buffer parts 3a is preferably located at a distance of about 1-5 μm from the through-hole electrode 9, and preferably has a width of about 1-3 μm.

Figure 6B:
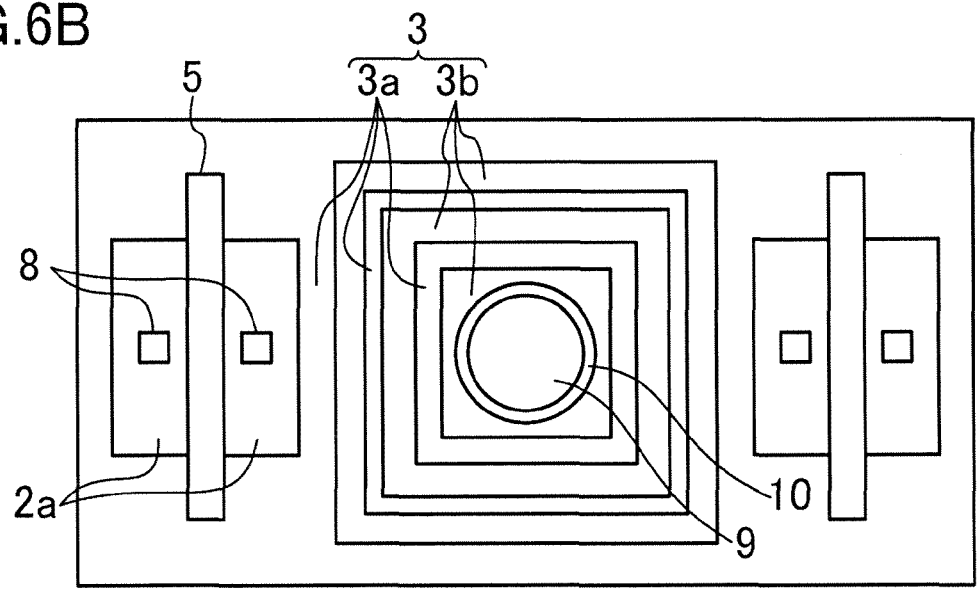

As illustrated in FIG. 6B, another pair of a stress buffer part 3a and an untreated region 3b may be provided. The number of the stress buffer parts 3a is not limited to two or three, and three or more stress buffer parts 3a may be provided between the through-hole electrode 9 and the impurity region 2a. A larger number of stress buffer parts 3a can more effectively stabilize operation of devices.

As the silicon semiconductor substrate 1, a semiconductor substrate having a constant surface orientation is used in general. The top and bottom sides of the rectangular stress buffer part 3a extend along a constant crystal axis of <110> and the left and right sides of the rectangular stress buffer part 3a extend along a constant crystal axis of <100>, for example. Variations in characteristics of, for example, transistors depending on an external stress is known to be symmetric and specific along constant crystal axes such as <110> and <100> in general. Thus, in a case where the shape of the stress buffer part 3a is a polygon and the sides of the polygon extend along constant crystal axes, stresses along specific crystal axes can be more effectively reduced. Accordingly, specific variation in characteristics of devices such as transistors located along crystal axes can be more effectively stabilized.

In the semiconductor device of the first variation of the first embodiment, specific variation in characteristics of devices such as transistors located along crystal axes can be more effectively stabilized. Accordingly, electrical characteristics of devices such as transistors and resistors can be more stabilized.

The method for fabricating a semiconductor device according to this variation is different from that of the first embodiment only in the shape of the stress buffer parts 3a. Processes for forming components of the first variation are the same as those of the first embodiment, and thus description thereof is not repeated.

(Second Variation of First Embodiment)

A semiconductor device according to a second variation of the first embodiment will be described with reference to FIGS. 7A and 7B. In this variation, the same components as those of the first embodiment and the first variation of the first embodiment are not described again, and only different aspects are described.

In the first variation of the first embodiment, the untreated regions 3b are provided in the outer periphery of the through-hole electrode 9. On the other hand, in the second variation of the first embodiment, as illustrated in FIG. 7A, an inner stress buffer part 3a is formed around the through-hole electrode 9 and is in contact with the insulating film 10, and an outer stress buffer part 3a is formed around the insulating film 10 at a predetermined distance from the insulating film 10 with an unreacted region 3b sandwiched between the outer stress buffer part 3a and the insulating film 10. That is, two stress buffer parts 3a are formed between the through-hole electrode 9 and the impurity region 2a of the active region. In other words, the two stress buffer parts 3a sandwich the untreated region 3b in a cross section perpendicular to the surface of the semiconductor substrate 1 and passing through the through-hole electrode 9 and the active region including the impurity region 2a. In addition, the through-hole electrode 9 is located approximately at the center of each of the stress buffer parts 3a. This structure further ensures insulation between the semiconductor substrate 1 and the through-hole electrode 9. Here, the inner stress buffer part 3a preferably has a width of about 1-5 μm. The outer stress buffer part 3a is preferably located at a distance from about 1-5 μm from the inner stress buffer part 3a, and preferably has a width of about 1-3 μm.

Figure 7A:
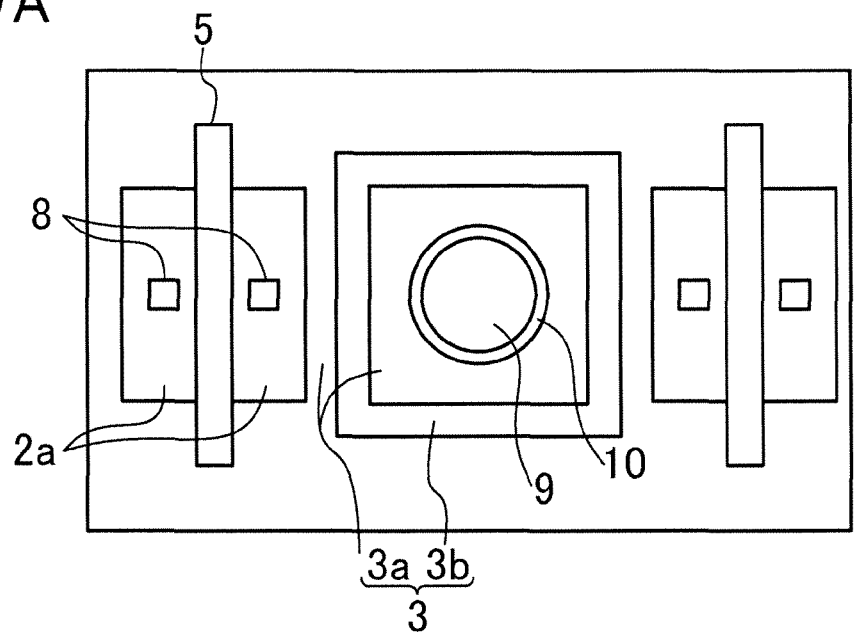
FIGS. 7A and 7B are plan views each illustrating a portion of a semiconductor device according to a second variation of the first embodiment.
Figure 7B:
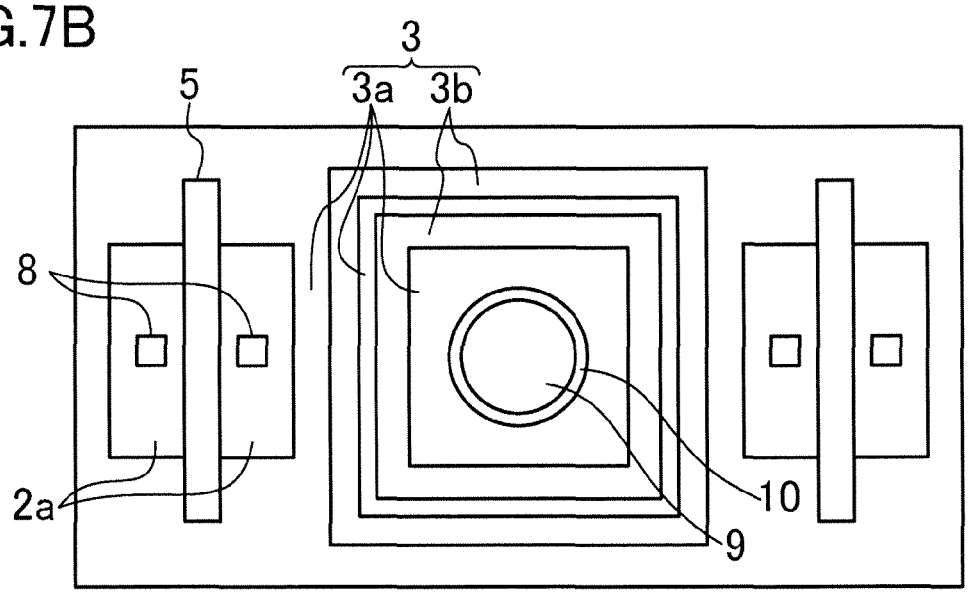

As illustrated in FIG. 7B, another stress buffer part 3a may be additionally formed between the through-hole electrode 9 and the impurity region 2a. The number of the stress buffer parts 3a is not limited to two or three, and three or more stress buffer parts 3a may be provided between the through-hole electrode 9 and the impurity region 2a.

In FIGS. 7A and 7B, the rectangular stress buffer parts 3a surround the through-hole electrode 9 located approximately at a center of each of the stress buffer parts 3a. Alternatively, the shape of each of the stress buffer parts 3a may be a polygon including a triangle except a rectangle, or may be a circle.

In the second variation of the first embodiment, a stress in the active region can be stabilized, and accordingly, electrical characteristics of devices such as transistors can be stabilized. In addition, insulation between the semiconductor substrate and the through-hole electrode can be further ensured.

A method for forming a semiconductor device according to this variation is different from that of the first embodiment only in the shapes and locations of the stress buffer parts 3a. Processes for forming components of the second variation are the same as those of the first embodiment, and thus description thereof is not repeated.

(Third Variation of First Embodiment)

A semiconductor device according to a third variation of the first embodiment will be described with reference to FIGS. 8A and 8B. In this variation, the same components as those of the first embodiment and the first and second variations of the first embodiment are not described again, and only different aspects are described.

Figure 8A:
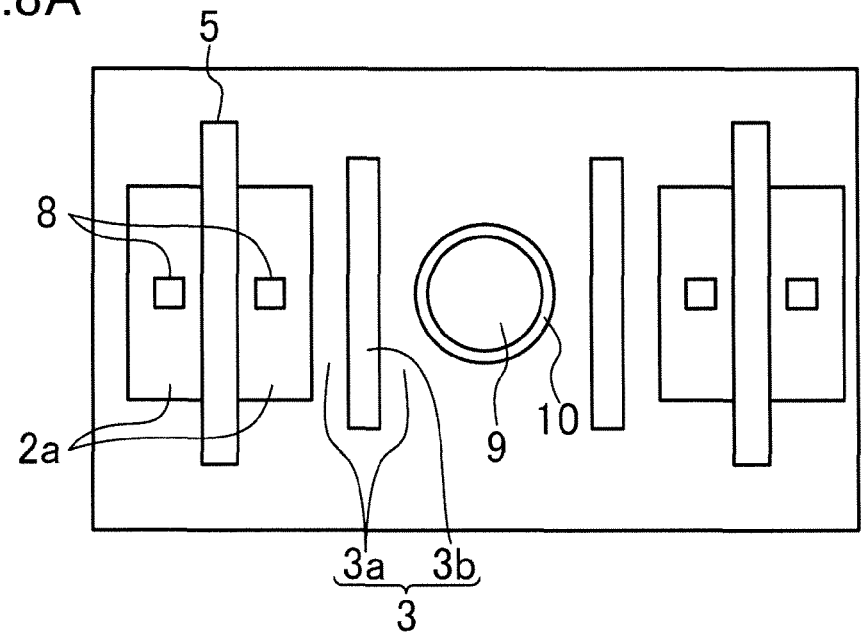
FIGS. 8A and 8B are plan views each illustrating a portion of a semiconductor device according to a third variation of the first embodiment.

As illustrated in FIG. 8A, in this variation, untreated regions 3b, which are regions where no stress buffer parts 3a are formed, do not surround the entire periphery of the through-hole electrode 9, but are located near the through-hole electrode 9, have, for example, rectangular shapes, and interrupt two directions at the left and right of the device region in the drawing. In this structure, two stress buffer parts 3a sandwich each of the untreated regions 3b in a cross section perpendicular to the surface of the semiconductor substrate 1 and passing through the through-hole electrode 9 and the active region including the impurity region 2a. The through-hole electrode 9 is located approximately at the center of each of the stress buffer parts 3a, as in the second variation of the first embodiment. The distance between the through-hole electrode 9 and each of the rectangular untreated regions 3b is preferably about 1-3 μm, and the width of each of the untreated regions 3b is preferably about 1-5 μm.

Figure 8B:
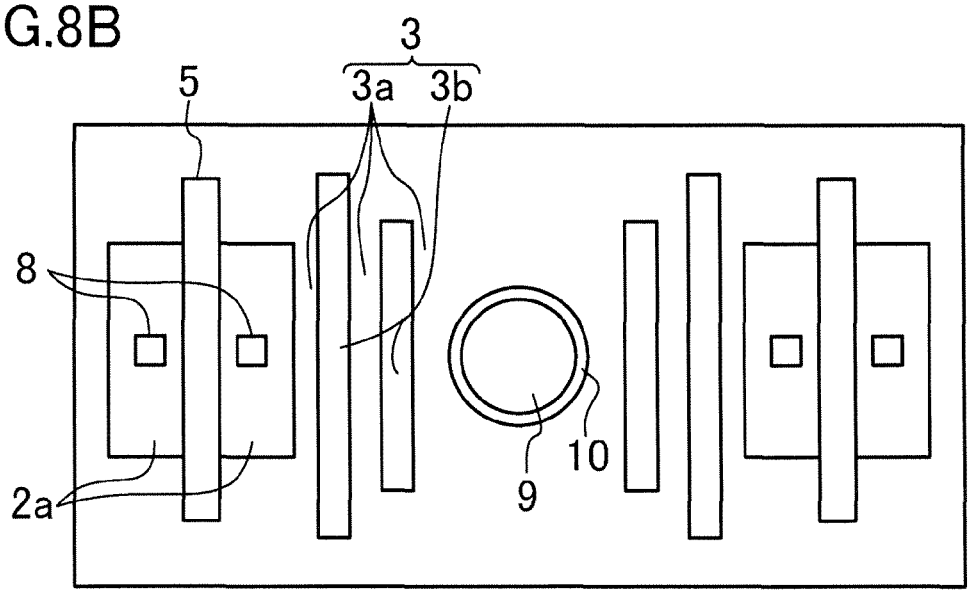

As illustrated in FIG. 8B, another untreated region 3b may be additionally provided between the through-hole electrode 9 and the impurity region 2a.

In this variation, the untreated regions 3b are symmetrical about the through-hole electrode 9 as a point of symmetry near the outer periphery of the through-hole electrode 9. The untreated regions 3b do not need to be symmetrical about a point, and may have a plurality of axes of symmetry.

The stress buffer parts 3a and the untreated regions 3b may be provided in consideration of the difference in response of stress depending on the surface orientation of the semiconductor substrate 1, the orientations of transistors as devices, and the types of the transistors (i.e., n-type or p-type), for example.

For example, in a semiconductor substrate of silicon whose principal surface has a surface orientation of {100}, in a case where the channel length (Lg) direction of a transistor is along a crystal axis of <110> and a through-hole electrode 9 is located on a line extending along the Lg direction or the channel width (W) direction of an nFET, a plurality of stress buffer parts 3a are preferably provided between the transistor and the through-hole electrode 9. Similarly, in a semiconductor substrate of silicon whose principal surface has a surface orientation of {100}, in a case where the transistor Lg is along a crystal axis of <110> and a through-hole electrode 9 is located on a line extending along the Lg direction or the W direction of a pFET, a plurality of stress buffer parts 3a are preferably provided between the transistor and the through-hole electrode 9.

In addition, in a semiconductor substrate of silicon whose principal surface has a surface orientation of {100}, in a case where the transistor Lg is along a crystal axis of <100> and a through-hole electrode 9 is located on a line extending along the Lg direction or the W direction of an nFET, a plurality of stress buffer parts 3a are preferably provided between the transistor and the through-hole electrode 9. Similarly, in a semiconductor substrate of silicon whose principal surface has a surface orientation of {100}, in a case where the transistor Lg direction is along a crystal axis of <100> and a through-hole electrode 9 is located on a line extending along the Lg direction or the W direction of a pFET, the pFET in such an arrangement is relatively less susceptible to a stress. Thus, even in a case where a plurality of stress buffer parts 3a are provided between the transistor and the through-hole electrode 9, the number of the stress buffer parts 3a is preferably smaller than those in the above cases. In such an arrangement of the pFET, the stress buffer parts 3a do not need to be provided depending on the degree of stress.

In the third variation of the first embodiment, it is possible to stabilize a stress in the active region, and accordingly, stabilize electrical characteristics of devices such as transistors.

A method for fabricating a semiconductor device according to this variation is different from that of the first embodiment only in the shapes and locations of the stress buffer parts 3a. Processes for forming components of the third variation are the same as those of the first embodiment, and thus description thereof is not repeated.

(Fourth Variation of First Embodiment)

A fourth variation of the first embodiment will be described with reference to FIGS. 9A and 9B. In this variation, components already described in the first embodiment and the first through third variations of the first embodiment are not described again, and only different aspects are described.

Figure 9A:
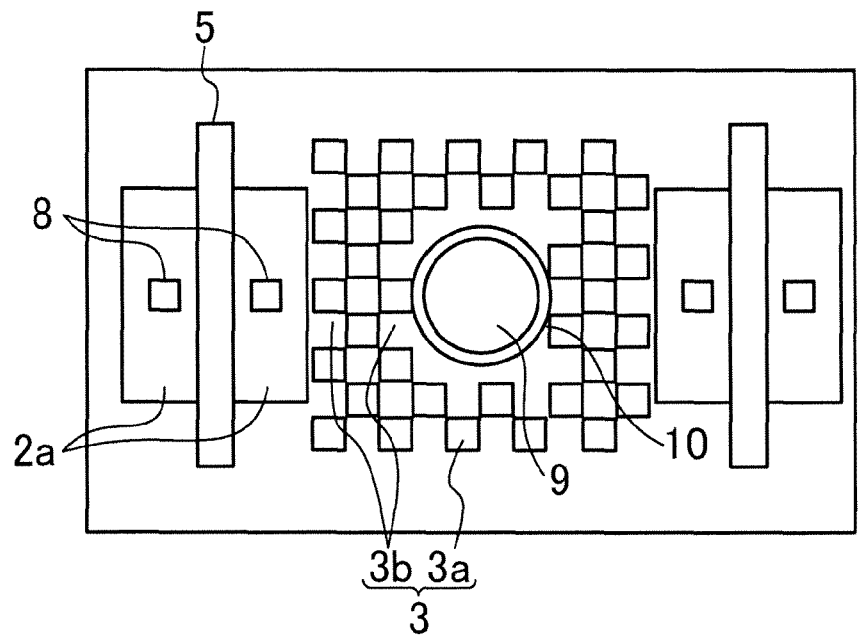
FIGS. 9A and 9B are plan views each illustrating a portion of a semiconductor device according to a fourth variation of the first embodiment.

As illustrated in FIG. 9A, in this variation, a plurality of stress buffer parts 3a and a plurality of untreated regions 3b are arranged in a staggered pattern around the through-hole electrode 9. The impurity regions 2a are formed at both sides of the pattern.

Figure 9B:
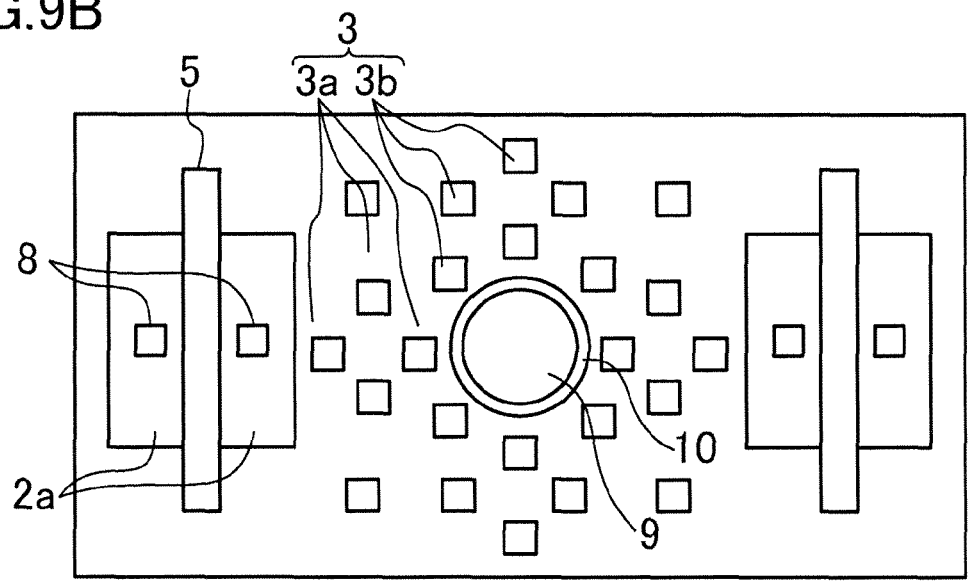

As illustrated in FIG. 9B, the stress buffer parts 3a and the untreated regions 3b do not need to form a staggered pattern, and the untreated regions 3b may be arranged at random around the through-hole electrode 9. In either case, two stress buffer parts 3a sandwich one untreated region 3b in a cross section perpendicular to the surface of the semiconductor substrate 1 and passing through the through-hole electrode 9 and the active region including the impurity regions 2a. This irregular arrangement is provided by appropriately calculating a stress in any possible arrangement of the through-hole electrode 9 and the active region where devices are located, in consideration of the surface orientation of the semiconductor substrate 1, the Lg and W directions of the devices, and the positional relationship between the through-hole electrode 9 and the devices, for example.

In the illustrated structures, as examples, the stress buffer parts 3a and the untreated regions 3b are formed around the through-hole electrode 9. This variation also includes any arrangement of a plurality of stress buffer parts 3a and a plurality of untreated regions 3b, including irregular arrangement.

In the semiconductor device of the fourth variation of the first embodiment, a stress in the active region can be stabilized, and accordingly, electrical characteristics of devices such as transistors can be stabilized.

A method for fabricating a semiconductor device according to this variation is different from that of the first embodiment only in the shapes and locations of the stress buffer parts 3a. Processes for forming components of the fourth variation are the same as those of the first embodiment, and thus description thereof is not repeated.

(Second Embodiment)

Figure 10:
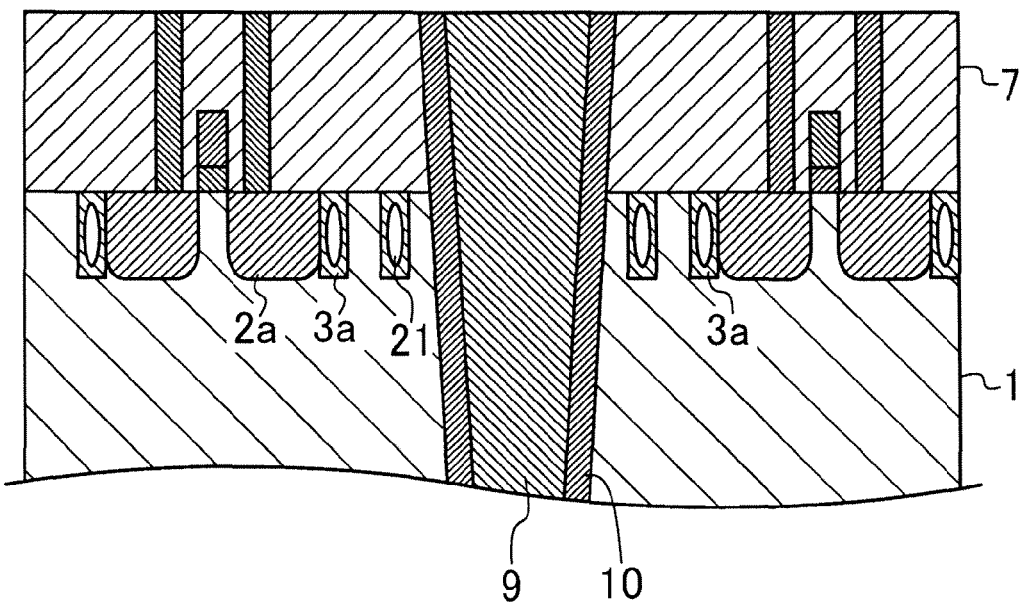
FIG. 10 is a cross-sectional view illustrating a semiconductor device according to a second embodiment.

A semiconductor device according to a second embodiment will be described with reference to FIG. 10. In this embodiment, the positional relationships between the stress buffer parts 3a and the through-hole electrode 9 described in the first embodiment and the first through fourth variations of the first embodiment are applicable to the second embodiment. Components already described in the first embodiment and the first through fourth variations of the first embodiment are not described again, and only different aspects are described. In FIG. 10, components formed in layers above a first interlayer insulating film 7 are not shown.

As illustrated in FIG. 10, in the second embodiment, stress buffer parts 3a are not completely filled with an insulating material such as $SiO_2$, SiON, or $Si_3N_4$, and include cavities 21 therein. Instead of the cavities 21, the stress buffer parts 3a may include air gaps or slits. In such structures, a stress from a through-hole electrode 9 can be further reduced. The air gaps, the slits, or the cavities 21 are preferably completely covered with, for example, the insulating material not to be exposed at the upper surfaces of the stress buffer parts 3a, in view of flatness in interconnection processes in its upper layers.

In the second embodiment, a stress in an active region can be stabilized, and accordingly, electrical characteristics of devices such as transistors can be stabilized.

In a method for fabricating a semiconductor device according to the second embodiment, the cavities 21 or the like can be formed by a known technique. The other processes are the same as those in the first embodiment, and description thereof is not repeated.

(Third Embodiment)

Figure 11:
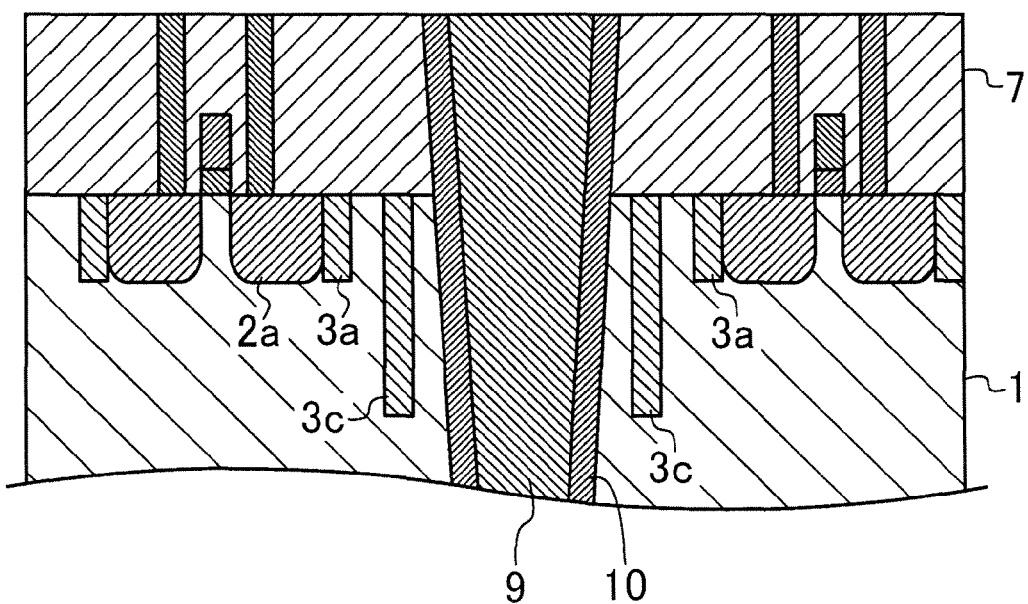
FIG. 11 is a cross-sectional view illustrating a semiconductor device according to a third embodiment.

A semiconductor device according to a third embodiment will be described with reference to FIG. 11. The positional relationships between the stress buffer parts 3a and the through-hole electrode 9 described in the first embodiment and the first through fourth variations of the first embodiment are applicable to the third embodiment. The first embodiment, the first through fourth variations of the first embodiment, and the second embodiment may be combined with the third embodiment. Components already described in the first embodiment, the first through fourth variations of the first embodiment, and the second embodiment are not described again, and only different aspects are described. In FIG. 11, components formed in layers above and a first interlayer insulating film 7 are not shown.

As illustrated in FIG. 11, in the third embodiment, the stress buffer parts include the usual stress buffer parts (first stress buffer parts) 3a and second stress buffer parts 3c that are located closer to a through-hole electrode 9 than the first stress buffer parts 3a are. In addition, the lower ends of the second stress buffer parts 3c are located below the lower ends of the first stress buffer parts 3a. The first stress buffer parts 3a and the second stress buffer parts 3c are completely filled with an insulating material such as $SiO_2$, SiON, or $Si_3N_4$. The lower ends of the first stress buffer parts 3a and the second stress buffer parts 3c are not exposed at the lower surface of a semiconductor substrate 1. The stress buffer parts having lower ends located below the lower ends of the usual stress buffer parts can more effectively reduce a stress from the through-hole electrode 9 as the distance to upper surface of the semiconductor substrate 1 decreases. In addition to the reduction of a stress along the depth direction, it is also possible to effectively cancel a tensile stress from the through-hole electrode 9 because the deeper stress buffer parts themselves generate a stronger compressive stress.

In the semiconductor device of the third embodiment, a stress in an active region can be stabilized, and accordingly, electrical characteristics of devices such as transistors can be stabilized.

In a method for fabricating a semiconductor device according to this embodiment, stress buffer parts may be formed by forming trenches for two types of stress buffer parts having different depths in the usual semiconductor substrate 1 through, for example, resist formation, a hard-mask process, and dry etching, and then filling the trenches with, for example, an insulating material. Other processes are the same as those of the first embodiment, and thus description thereof is not repeated.

(Variation of Third Embodiment)

Figure 12:
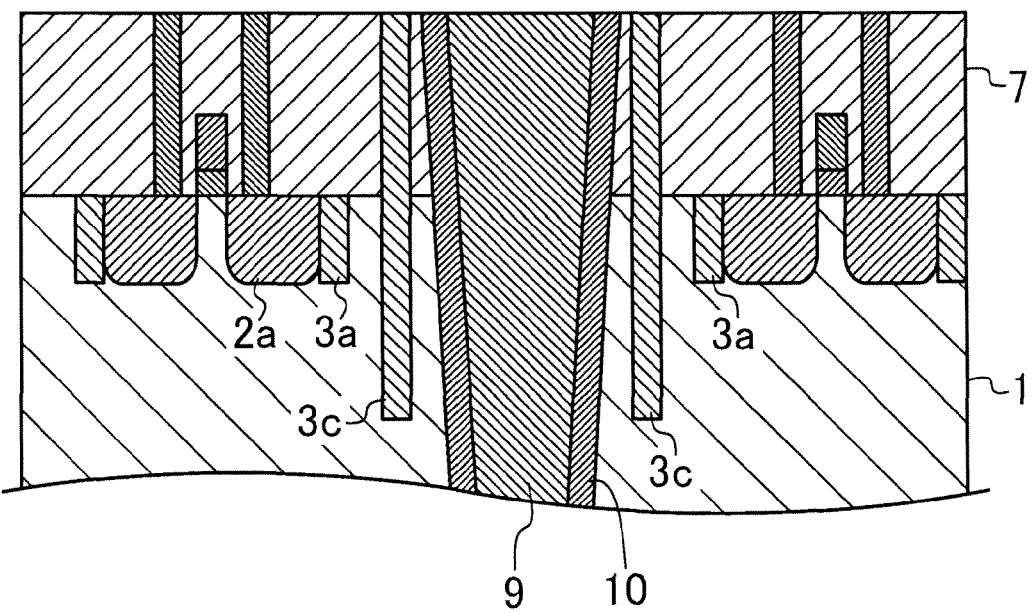
FIG. 12 is a cross-sectional view illustrating a semiconductor device according to a variation of the third embodiment.

A semiconductor device according to a variation of the third embodiment will be described with reference to FIG. 12. In this variation, the same components as those of the first through third embodiments and the variations of the first embodiment are not described again, and only different aspects are described. In FIG. 12, components formed in layers above a first interlayer insulating film 7 are not shown.

As illustrated in FIG. 12, this variation is different from the third embodiment in that the upper surfaces of the second stress buffer parts 3c are exposed at the upper surface of the first interlayer insulating film 7.

Since the second stress buffer parts 3c that are located closer to the through-hole electrode 9 than the first stress buffer parts 3a are reach the upper surface of the first interlayer insulating film 7, a stress below the upper surface of the semiconductor substrate 1 can be reduced, and in addition, a stress above the semiconductor substrate 1 can also be reduced. The second stress buffer parts 3c are preferably made of a material having a thermal expansion coefficient larger than that of the material for the first interlayer insulating film 7. In this case, the advantage of reducing a stress above the semiconductor substrate 1 can be enhanced.

In a semiconductor device according to this variation of the third embodiment, a stress in the active region can be stabilized, and accordingly, electrical characteristics of devices such as transistors can be stabilized.

In a method for fabricating a semiconductor device according to this variation, in the process step illustrated in FIG. 4B, before formation of the electrode holes 20, the entire upper surface of the first interlayer insulating film 7 are covered with the resist, and only desired regions for forming stress buffer parts are exposed by lithography. Then, etching such as dry etching is performed on portions of the desired regions near regions where through-hole electrodes 9 are to be formed in a subsequent step, from the upper surface of the first interlayer insulating film 7. The etching is performed to reach a potion deeper than the depth of general STI, thereby forming trenches. In this process, the bottoms of the trenches do not reach the back surface of the semiconductor substrate 1. Thereafter, the resist, for example, is removed by ashing and cleaning, and then the trenches are completely filled with an insulating material such as $SiO_2$, SiON, or $Si_3N_4$. Subsequently, planarization by, for example, CMP may be performed. The other processes are the same as those in the first embodiment, and description thereof is not repeated.

In the first through third embodiments and the variations thereof, the active region 6 including, for example, transistors, the through-hole electrodes 9, and the stress buffer structures (i.e., the stress buffer parts 3a, the rounded portions 18, and the divots 19) shown in the drawings have sizes adjusted to illustrate the concepts of these structures. The actual sizes and proportions may be different from those shown in the drawings.

In the first through third embodiments and the variations thereof, in the through-hole electrode from which a tensile stress is generated, the absolute value of the stress can be reduced by adjusting a process by copper plating, utilizing the difference in copper crystallinity, adjusting a heat treatment after the copper plating, and adjusting a material for barrier films around the through-hole electrodes, for example. To reduce the influence of a stress by adjusting the thermal expansion coefficient of copper itself, at least one type of an additional metal, for example, except copper may be added to copper in order to further reduce a tensile stress in the upper portion of the semiconductor substrate. In addition, to reduce the influence of a stress by adjusting the thermal expansion coefficient of copper itself, the crystallinity and/or the grain boundary size, for example, can be adjusted. The temperature of a heat treatment after copper plating may be optimized to reduce a resultant stress.

In the first through third embodiments and the variations thereof, in the stress buffer parts from which a compressive stress is generated, the absolute value of the stress can be reduced by adjusting a process for filling an insulating material, the type of the insulating material used for the filling, the difference in composition and crystallinity of the insulating material, a heat treatment after the filling with the insulating material, the type of a material provided near the stress buffer parts, the rounded amount of the semiconductor substrate, the amount of the divots, and the depths of the stress buffer parts, for example.

In the first through third embodiments and the variations thereof, the stress buffer parts may penetrate not only the upper surface of the semiconductor substrate but also the lower surface thereof. In this case, a stress on, and characteristics of, devices in the upper portion of the semiconductor substrate can be stabilized, and a stress from the upper portion to lower portions of the semiconductor substrate can also be stabilized. Thus, device characteristics such as a junction resistance and a leakage component of a resistor that is deep as a device or a device including a deep well, for example, can be stabilized.

The first through third embodiments and the variations thereof may be combined in any way. For example, the second stress buffer parts 3c deeper than the lower ends of the first stress buffer parts 3a may include cavities 21.

As described above, a semiconductor device and a method for fabricating the semiconductor device according to the present disclosure can reduce the influence of a stress from a through-hole electrode on devices, and can stabilize electrical characteristics of devices such as transistors in active regions. The present disclosure is useful especially for a semiconductor device including through-hole electrodes and a method for fabricating such a semiconductor device.

What is claimed is:

1. A semiconductor device, comprising:
an active region located in an upper portion of a semiconductor substrate;
a through-hole electrode penetrating the semiconductor substrate, and made of a conductor having a thermal expansion coefficient larger than that of a material for the semiconductor substrate; and
a stress buffer region located in the upper portion of the semiconductor substrate and sandwiched between the through-hole electrode and the active region, wherein
the stress buffer region does not penetrate the semiconductor substrate and includes a stress buffer part made of a material having a thermal expansion coefficient larger than that of the material for the semiconductor substrate and an untreated semiconductor region where the stress buffer part is not present,
an end of the upper portion of the semiconductor substrate near the stress buffer part is rounded,
a trench is provided only in the end of the upper portion of a boundary between the semiconductor substrate and the stress buffer part, and
the stress buffer part is located in at least two locations sandwiching the untreated semiconductor region in a cross section perpendicular to a surface of the semiconductor substrate and passing through the through-hole electrode and the active region, the untreated semiconductor region being part of the semiconductor substrate.

2. A semiconductor device of claim 1, wherein the stress buffer part is made of a material including a high-density plasma film or a sub-atmospheric CVD oxide film.

3. The semiconductor device of claim 1, wherein the untreated semiconductor region includes a plurality of untreated semiconductor regions arranged at random around the through-hole electrode.

4. The semiconductor device of claim 1, wherein the stress buffer part includes a cavity therein.

5. The semiconductor device of claim 1, wherein
the stress buffer part includes a first stress buffer part and a second stress buffer part that is located closer to the through-hole electrode than the first stress buffer part is, and
the second stress buffer part has a lower end located below a lower end of the first stress buffer part.

6. The semiconductor device of claim 1, further comprising:
a first insulating film located on the semiconductor substrate, wherein
the through-hole electrode penetrates the first insulating film and the semiconductor substrate,
the stress buffer part includes a plurality of stress buffer parts, and
at least one of the stress buffer parts penetrates the first insulating film.

7. The semiconductor device of claim 1, wherein
the stress buffer part includes a plurality of stress buffer parts,
the untreated semiconductor region includes a plurality of untreated semiconductor regions, and the stress buffer parts and the untreated semiconductor regions are arranged in a staggered pattern around the through-hole electrode.

8. The semiconductor device of claim 1, wherein the trench has a depth of 13 nm or more.

9. The semiconductor device of claim 1, wherein
the semiconductor substrate is made of silicon whose principal surface has a surface orientation of {100},
the device is an n-type field effect transistor or a p-type field effect transistor whose channel length direction is along a crystal axis of <110>, and
the through-hole electrode is located on a line along the channel length direction or a channel width direction.

10. The semiconductor device of claim 1, wherein
the semiconductor substrate is made of silicon whose principal surface has a surface orientation of {100},
the device is an n-type field effect transistor whose channel length direction is along a crystal axis of <100>, and
the through-hole electrode is located on a line along the channel length direction or a channel width direction.

11. The semiconductor device of claim 1, wherein
the semiconductor substrate is made of silicon whose principal surface has a surface orientation of {100},
the device is a p-type field effect transistor whose channel length direction is along a crystal axis of <100>,
the through-hole electrode is located on a line along the channel length direction or a channel width direction,
the stress buffer part includes a plurality of stress buffer parts, and
the number of the stress buffer parts is smaller than the number of the stress buffer parts in a case where the channel length direction is not along a crystal axis of <100>or a case where the device is an n-type field effect transistor.

12. A semiconductor device, comprising:
an active region formed in an upper portion of a semiconductor substrate;
a through-hole electrode penetrating the semiconductor substrate, and made of a conductor having a thermal expansion coefficient larger than that of a material for the semiconductor substrate; and
a stress buffer region located in the upper portion of the semiconductor substrate and sandwiched between the through-hole electrode and the active region, wherein
the stress buffer region does not penetrate the semiconductor substrate and includes stress buffer parts made of a material having a thermal expansion coefficient larger than that of the material for the semiconductor substrate and an untreated semiconductor region where the stress buffer parts are not present,
the untreated semiconductor region and at least one of the stress buffer parts are circles or polygons whose centers are located approximately at the through-hole electrode, and
the stress buffer parts are located in at least two locations sandwiching the untreated semiconductor region in a cross section perpendicular to a surface of the semiconductor substrate and passing through the through-hole electrode and the active region, the untreated semiconductor region being part of the semiconductor substrate.

13. A semiconductor device of claim 12, wherein the stress buffer parts are made of a material including a high-density plasma film or a sub-atmospheric CVD oxide film.

14. The semiconductor device of claim 12, wherein each of the stress buffer parts includes a cavity therein.

15. The semiconductor device of claim 12, wherein
each of the stress buffer parts includes a first stress buffer part and a second stress buffer part that is located closer to the through-hole electrode than the first stress buffer part is, and
the second stress buffer part has a lower end located below a lower end of the first stress buffer part.

16. The semiconductor device of claim 12, further comprising:
a first insulating film located on the semiconductor substrate, wherein
the through-hole electrode penetrates the first insulating film and the semiconductor substrate, and
at least one of the stress buffer parts penetrates the first insulating film.

17. The semiconductor device of claim 12, wherein
the semiconductor substrate is made of silicon whose principal surface has a surface orientation of {100},
the device is an n-type field effect transistor or a p-type field effect transistor whose channel length direction is along a crystal axis of <110>, and
the through-hole electrode is located on a line along the channel length direction or a channel width direction.

18. The semiconductor device of claim 12, wherein
the semiconductor substrate is made of silicon whose principal surface has a surface orientation of {100},
the device is an n-type field effect transistor whose channel length direction is along a crystal axis of <100>, and
the through-hole electrode is located on a line along the channel length direction or a channel width direction.

19. The semiconductor device of claim 12, wherein
the semiconductor substrate is made of silicon whose principal surface has a surface orientation of {100},
the device is a p-type field effect transistor whose channel length direction is along a crystal axis of <100>,
the through-hole electrode is located on a line along the channel length direction or a channel width direction, and
the number of the stress buffer parts is smaller than the number of the stress buffer parts in a case where the channel length direction is not along a crystal axis of <100>or a case where the device is an n-type field effect transistor.

* * * * *